United States Patent [19]

Lim et al.

[11] Patent Number: 4,569,121

[45] Date of Patent: Feb. 11, 1986

[54] METHOD OF FABRICATING A PROGRAMMABLE READ-ONLY MEMORY CELL INCORPORATING AN ANTIFUSE UTILIZING DEPOSITION OF AMORPHOUS SEMICONDUCTOR LAYER

[75] Inventors: Sheldon C. P. Lim, Sunnyvale; Douglas F. Ridley, Saratoga; Saiyed A. Raza, Santa Clara; George W. Conner, Ben Lomond, all of Calif.

[73] Assignee: Signetics Corporation, Sunnyvale, Calif.

[21] Appl. No.: 472,804

[22] Filed: Mar. 7, 1983

[51] Int. Cl.[4] .................... H01L 21/20; H01L 21/479
[52] U.S. Cl. ........................................ 29/574; 29/575;
29/576 B; 29/576 C; 29/576 E; 29/578; 29/584;
29/586; 148/1.5; 148/174; 148/187; 148/DIG.
55; 357/2; 357/45; 357/51; 357/59; 365/94;
365/103; 365/105; 427/86
[58] Field of Search .................... 148/1.5, 174, 187;
29/574, 575, 576 B, 576 E, 576 C, 577 C, 578,
584, 586; 357/2, 45, 51, 59, 91; 427/86; 365/94,
103-105

[56] References Cited

U.S. PATENT DOCUMENTS

| | | | |
|---|---|---|---|
| 3,990,098 | 11/1976 | Mastrangelo | 357/2 |
| 4,146,902 | 3/1979 | Tanimoto et al. | 357/51 X |
| 4,174,521 | 11/1979 | Neale | 357/45 |
| 4,203,123 | 5/1980 | Shanks . | |
| 4,403,399 | 9/1983 | Taylor | 29/574 |
| 4,420,766 | 12/1983 | Kasten | 357/51 X |
| 4,442,507 | 4/1984 | Roesner | 365/100 |

FOREIGN PATENT DOCUMENTS

| | | |
|---|---|---|
| EP68058 | 1/1983 | France . |
| 2065972A | 7/1981 | United Kingdom . |
| 2066566A | 7/1981 | United Kingdom . |
| 2075256A | 11/1981 | United Kingdom . |
| 2086654A | 5/1982 | United Kingdom . |

OTHER PUBLICATIONS

Tanimoto et al., "Novel 14 V Programmable . . . Poly-Si Resistor . . . ", IEEE J. Solid-State Circuits, vol. SC-17, No. 1, Feb. 1982, pp. 62–68.

*Primary Examiner*—William G. Saba
*Attorney, Agent, or Firm*—R. J. Meetin; R. Mayer; J. Oisher

[57] ABSTRACT

In fabricating a PROM cell, an electrical isolation mechanism (44 and 32) is formed in a semiconductive body to separate islands of an upper zone (36) of first type conductivity (N) in the body. A semiconductor impurity is introduced into one of the islands to produce a region (48) of opposite type conductivity (P) that forms a PN junction laterally bounded by the island's side boundaries. A highly resistive amorphous semiconductive layer (58) which is irreversibly switchable to a low resistive state is deposited above the region in such a manner as to be electrically coupled to the region. A path of first type conductivity extending from the PN junction through another of the islands to its upper surface is created in the body to complete the basic cell.

19 Claims, 10 Drawing Figures

METHOD OF FABRICATING A PROGRAMMABLE READ-ONLY MEMORY CELL INCORPORATING AN ANTIFUSE UTILIZING DEPOSITION OF AMORPHOUS SEMICONDUCTOR LAYER

BACKGROUND OF THE INVENTION

This invention relates to semiconductor memories and in particular to programmable read-only memories.

Most programmable read-only memories (PROMS) currently being manufactured utilize metallic fusible links, or fuses, as the programming element in the memory array. These fuses laterally connect an array element, such as a diode, with a bit line. All of these components and/or their connections occupy space on the semiconductor chip area, such as the metal bit line, the laterally extending metal fuse, and the metal contact pad to the diode, for example. Since the memory array may contain thousands of array cells constituted by these components, such as 16,384 cells for a 16K PROM, the memory array occupies a major portion of the integrated circuit chip area for a high density state of the art PROM. Any space savings that can be achieved in the individual memory cells of the array will significantly reduce the size of the integrated chip and thereby increase the yield, that is, the number of good chips producible from a given wafer. As the yield increases, the unit manufacturing cost goes down.

One means of reducing the cell area would be to replace the lateral metal fuse with one that does not occupy any additional space than is required for the metal bit line and the contact to the diode. This could be done with a programmable element located directly over the diode. Some researchers have proposed vertical antifuses in the form of destructible diodes of reverse electrical orientation from the array diode. One such device of this type is disclosed in U.S. Pat. No. 3,641,516 to Castrucci et al. Programming of this type of antifuse is accomplished by subjecting the destructible diode to high reverse current flow and causing aluminum migration from the contact and bit line to short circuit the destructible diode.

It should be mentioned here that an antifuse is the opposite of a fuse link. An unprogrammed antifuse is non-conducting, and it is programmed by changing it to a conductive or low resistance state so as to close a circuit between the bit line and the array diode. A fuse link, on the other hand, is conductive when unprogrammed, and it is programmed by changing it to a non-conducting state so as to open or break the circuit between the bit line and the array diode.

Other proposals for an antifuse in memories have involved the use of deposited films of chalcogenide elements or amorphous silicon which become conducting when subjected to an electrical bias voltage. UK patent application GB No. 2086654A discloses deposited films of amorphous silicon and UK patent application GB No. 2065972A discloses deposited films of chalcogenide elements. Each of these references proposes coupling the antifuse to a diode which is either formed from two deposited films located apart from the semiconductor body, or is formed by depositing a metallic film on the surface of the semiconductor body so as to form a Schottky diode therewith. While these references disclose coupling the antifuse to a MOS field-effect transistor formed within the body of the semiconductor, the transistor semiconductor junctions are oriented laterally in the sense that current flow occurs in the channel region in a direction parallel to the major semiconductor surface.

SUMMARY OF THE INVENTION

According to the invention a semiconductor memory structure comprises a semiconductor body having a surface layer of first type conductivity and a first region of second type conductivity formed in a selected portion of the surface layer to produce a semiconductive junction therewith. A second region is formed as a deposited layer over the first region. A third region of first type conductivity is formed in a selected portion of the surface layer laterally spaced from the first and second regions, and is heavily doped to have a higher conductivity than the surface layer.

A buried layer of first type conductivity extends into the surface layer beneath the third region and the first and second regions and is heavily doped to form a low resistance path between the third region and the semiconductive junction. The surface layer, the first and third regions, and the buried layer are crystalline semiconductor in form. The second region is in the form of a deposited layer of amorphous silicon and is electrically switchable irreversibly from a high resistive state to a low resistive state upon application of a bias voltage of predetermined magnitude applied between the second and third regions with a polarity in the forward direction of the semiconductive junction.

DETAILED DESCRIPTION OF THE PREFERRED EMBODIMENT

Figure 1:
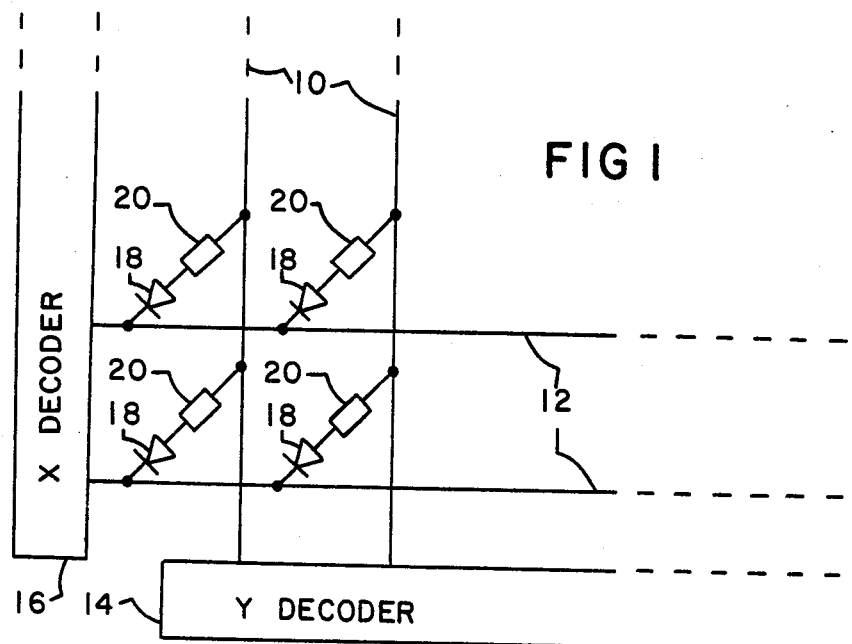
FIG. 1 is an electrical schematic diagram of a portion of a bipolar memory array.
Figure 2:
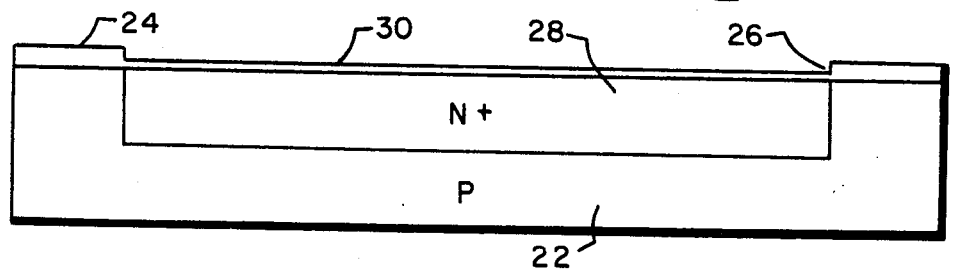
FIGS. 2 through 10 are cross sectional views showing the various process steps for fabricating an integrated circuit memory array incorporating a deposited amorphous silicon antifuse structure according to the invention.
Figure 3:
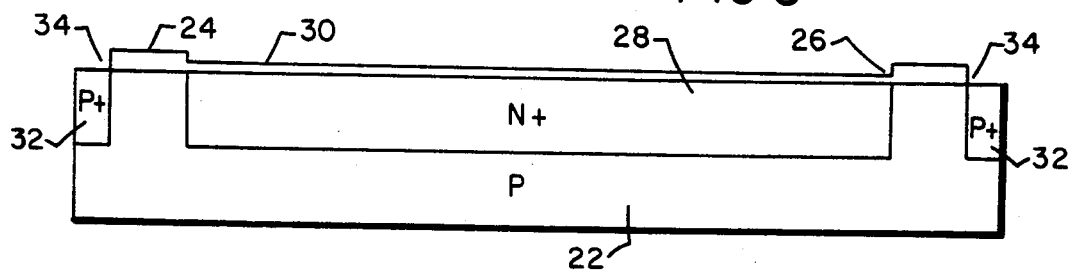

In the schematic diagram of FIG. 1 there is shown a junction diode memory array in which a plurality of bit lines 10 are arranged in columns and a plurality of word lines 12 are arranged in rows. The bit lines 10 are coupled to a Y decoder 14 and the word lines 12 are coupled to an X decoder 16 for making the column and row selection in the usual manner.

At each cross-over of a bit line 10 and word line 12 there is a junction diode 18 and an antifuse 20. When an electrical potential difference is applied between a bit line 10 and a word line 12 so as to forward bias the junction diode 18 connected therebetween, an electrical sensing current will flow between the two selected lines 10 and 12 provided the antifuse 20 is in the conducting state.

To program a given element, a high potential difference can be applied which will supply sufficient voltage bias across the antifuse 20 to change it from a normally high resistance state to a low resistance or conducting state, thereby completing the series circuit between a pair of lines 10 and 12. Then when a lower sensing voltage is applied between the two lines 10 and 12, a sensing current will flow. In the absence of a programming voltage bias applied between selected lines 10 and 12, the antifuse 20 is highly resistive or non-conducting and no sensing current can flow. The presence of sensing current can indicate one state such as a zero (0) and the absence of sensing current can indicate the other state such as a one (1).

Reference is now made to FIGS. 2 through 10 which show the sequence of steps for fabricating a memory array according to the invention. The fabrication process shown in FIG. 2 starts with furnishing a P type substrate 22 of semiconductor material, such a silicon, which is lightly doped to have about 7 to 21 ohm-centimeters of resistivity and has a crystal axis orientation of 111. On the surface of the silicon substrate 22 a thick oxide layer 24 is grown to a thickness of one micrometer or more depending upon the doping source to be used in forming the buried layer to be described.

Openings 26 are formed in the oxide layer 24 by photolithographic processing means, such as photomasking and etching, to delineate the regions where N type diffusions are next made for the N+ buried layers 28. While only one opening 26 is shown, it is understood that the same openings 26 and diffusions can be repeated as many times as necessary over the area of the substrate to produce the desired number of elements of the array. Also, similar other openings and diffusions can be made simultaneously to provide the buried collector regions for peripheral transistors that are located outside the area boundaries of the memory array.

A heavy dosage of N type dopant, such as arsenic or antimony, is introduced by diffusion or ion implantation to form the N+ regions 28. A protective oxide layer 30 of about 0.25 micrometer is grown on the N+ region 28 during the subsequent annealing which drives the N' region 28 to a depth of about 2.5 micrometers and results in a sheet resistance for the N+ region 28 of 30 ohms per square, as dictated by the requirements of the peripheral transistors rather than the antifuse structure.

Another masking and etching procedure is carried out to delineate and produce the P+ regions 32 surrounding the N+ regions 28. These P+ regions 32 are formed by introducing a P type dopant, such as boron, by diffusion or ion implantation through openings 34 in the mask comprising oxide layers 24 and 30. The P+ regions 32 aid in isolating the memory cell areas from each other and from the other components on the same chip. During the subsequent annealing process a thin oxide layer, not shown, grows over the P+ regions 32.

Figure 4:
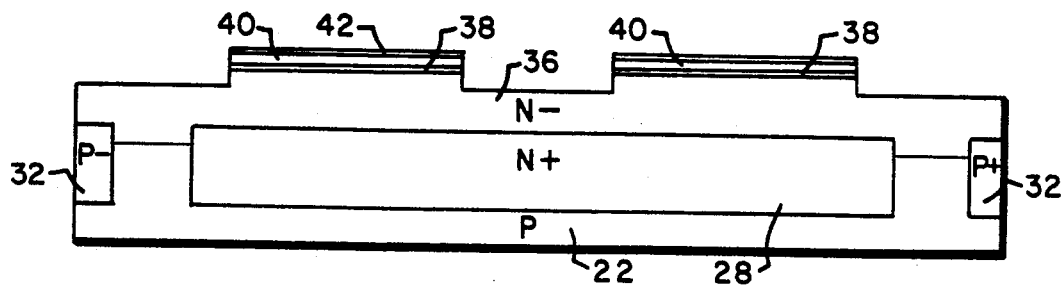
Figure 5:
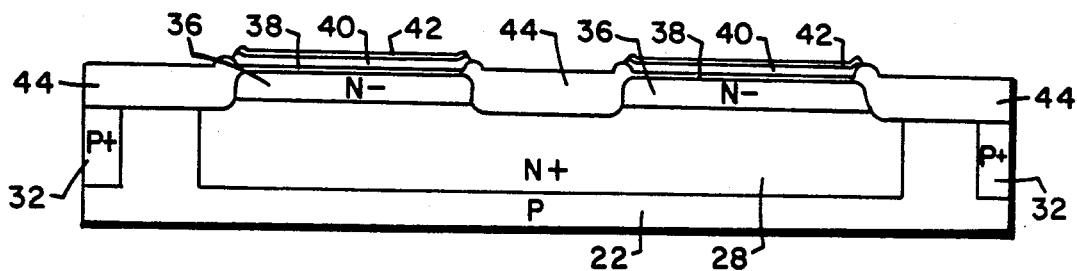

After the P+ regions 32 are formed, all the oxide in layers 26 and 30 and over the P+ regions 32 is stripped away to the bare silicon, and a lightly doped epitaxial layer 36 of N type silicon is grown on the silicon substrate 22 including the N+ buried regions 28 and P+ buried regions 32. The thickness of the epitaxial layer 36 is about 1.9 micrometers and the resistivity is about 0.7 ohm centimeters. The epitaxial layer 36 is shown in FIG. 4. During growth of the epitaxial layer 36, the P+ regions and the N+ buried regions 28 diffuse in all directions and grow in size, as shown.

Following the formation of the epitaxial layer 36, a silicon dioxide layer 38 of about 280 angstroms is grown on the entire surface of the epitaxial layer 36, followed by deposition on the oxide layer 38 of a layer 40 of silicon nitrode of about 0.13 micrometer in thickness. The silicon nitride layer 40 is then oxidized to produce a layer 42 of silicon dioxide thereon of about 200 angstroms thick. The three layer sandwich including bottom oxide layer 38, silicon nitride layer 40 and top oxide layer 42 is masked and etched, layer by layer, down to the surface of the epitaxial layer 36 to produce spaced apart layer portions of the sandwiched structure. In FIG. 4, two layer portions are shown overlying the buried N+ region 28. The surface of the epitaxial layer 36 is bare on either side of the layer portions. The oxide layers 38 and 42 may be etched with a hydrofluoric acid solution and the silicon nitride layer 40 may be etched with 150° C. phosphoric acid.

Following the etching of the three layer sandwich including layers 38, 40, 42, the epitaxial layer 36 not masked by the three layer sandwich is etched, as by hydrofluoric, nitric and acetic acids with iodine solutions, down to a depth of about 0.65 micrometer. The etched surface of the epitaxial layer 36 is then thermally oxidized to a thickness of about 1.3 micrometers. Since the oxide grows both outwardly from the silicon surface as well as inwardly into the silicon the surface of the locally oxidized regions, shown at 44 in FIG. 5, will thicken beyond the original surface level of the etched epitaxial layer 36 and merge with the bottom silicon dioxide layer 38 of the three layer sandwich. The bottom of the oxide regions 44 reach the P+ regions 32 and the N+ buried layer 28. The oxide regions 44, together with the P+ regions 32 serve to provide the necessary isolation between elements of the memory structure.

Figure 6:
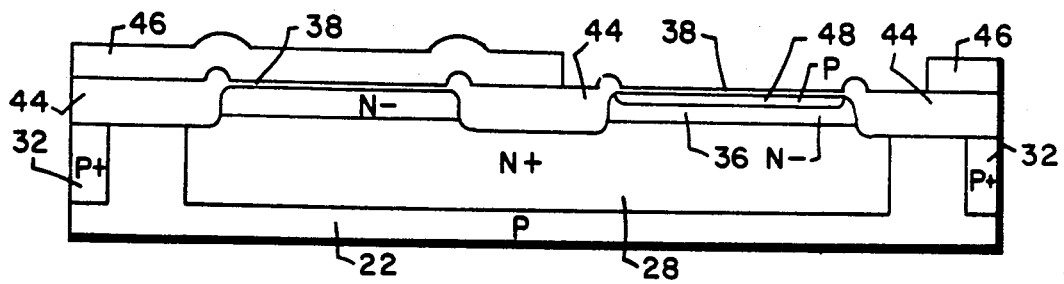

After the oxide isolation regions 44 are formed, the top oxide layer 42 and the silicon nitride layer 40 are etched away and a photoresist layer 46 is deposited over the epitaxial layer 36. The photoresist layer 46 is then masked and etched to remove it from those areas where it is desired to introduce dopant ions into the epitaxial layer 36 to produce the junction diodes for the memory array. Because of the presence of the oxide isolation regions 44 which themselves act to mask the dopant ions and provide self alignment, the masking can be oversize and lacking in precision. The photoresist is removed only over one of the portions of the N+ layer 28, and it remains over the other part. The thin oxide layer 38 is permitted to remain over the semiconductor regions 36 to rovide screening for the implanted ions. If the dopant impurities are introduced by diffusion, the thin oxide layer 38 is removed prior to diffusion. The implanted or diffused ions are P type, such as boron, and following annealing, the P type regions 48 are produced, as shown in FIG. 6. The P type regions 48 are moderately doped, are spaced from the N+ layer 28, and form a semiconductor junction with the N doped epitaxial layer 36. The same implant or diffusion of the P dopants into other regions serves as the bases of the peripheral transistors.

Figure 7:
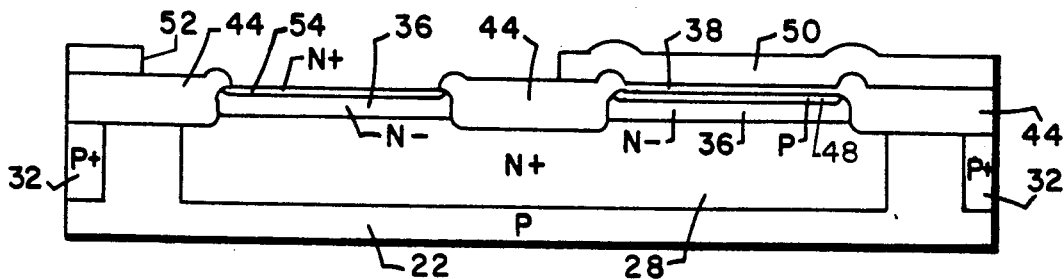

The next step is shown in FIG. 7 and comprises covering the wafer with a photoresist layer 50. The photoresist layer 50 is then masked and etched to provide an opening 52 over the portion of the epitaxial layer 36 spaced from the adjacent P type region 48 to define a region where an N+ contact region 54 is to be formed in the epitaxial layer 36. The N+ contact region 54 is produced by diffusion, or implantation followed by annealing. A heavy dosage of N type impurity such as arsenic may be used. An oversized opening 52 can be used because of the self alignment action of the surrounding isolation regions 44. The N+ contact region 54 serves as a conductive connection to the PN junction diode formed by the P+ region 48 and the N type epitaxial layer 36, with a low resistance path being provided through the N+ buried layer 28. The same implant or diffusion of these N type dopants into other regions of the chip serves as the emitters of the peripheral transistors. Following the N+ implant, the wafer is annealed at about 1,000° C. to bring the emitters and bases of the transistors to their final junction depths as required for proper transistor action.

Figure 8:
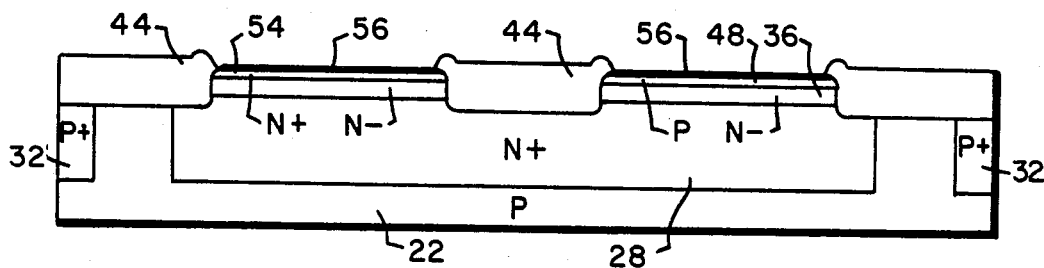

The next series of steps is shown in FIG. 8 and comprises selectively etching away the thin oxide layer 38 over the P type region 48 while using a photoresist mask (not shown) over the remaining areas. Following removal of the photoresist mask, a metal silicide layer 56 is formed on all exposed silicon areas, namely the N+ contact region 54 and the P type region 48. The metal silicide layer 56 forms an ohmic contact with the silicon and is formed by reacting a suitable metal or metal alloy with the silicon surface at a deposition temperature of 450°–500° C. A preferred metal alloy is one consisting of 60% nickel and 40% platinum, which when alloyed with the silicon forms a ternary alloy. The platinum-nickel-silicide alloy layer 56 is often referred to as platinel silicide. Reference is made to U.S. Pat. No. 3,855,612 issued to Rosvold for a further description of platinel silicide contacts. Besides platinel silicide, the metal silicide layer 56 may be formed from platinum silicide or palladium silicide, for example. Any metal that does not react with the silicon, such as metal which deposits on the oxide regions 44 is removed, such as by etching with aqua regia, without affecting the silicide layer 56.

Figure 9:
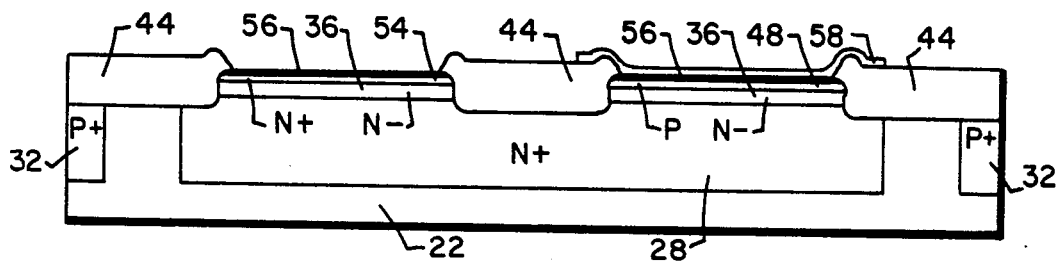

The next series of steps is shown in FIG. 9 and comprises depositing a thin layer or film 58 of amorphous silicon on the metal silicide layer 56 formed on the surface of the P type region 48. The amorphous silicon film 58 may be deposited first over the entire wafer and then removed by photoresist masking and selective etching from the undesired area, i.e. all the areas except over the array PN junction diodes which comprise regions 36 and 48. Plasma etching in carbon tetrafluoride ($CF_4$) or sulphurhexafluoride ($SF_6$) may be used.

The amorphous silicon film 58 may be deposited by sputtering, evaporation, chemical vapor deposition, or by plasma enhanced chemical vapor deposition. Regardless of the deposition process used, the amorphous silicon film 58 is deposited to a thickness in the range of 400–1100 angstroms to contact the metal silicide layer 56.

In a typical sputtering operation using a DC magnetron sputtering apparatus, a target of silicon doped with about 0.1% phosphorus, may be used. The power may be in the neighborhood of 1200 watts and the gas atmosphere may be argon at a pressure of $2 \times 10^{-3}$ to $3 \times 10^{-3}$ torr. The substrate is at room temperature.

In a typical chemical vapor deposition process, also referred to as low pressure chemical vapor deposition (LPCVD), 54 SCCM of silane, $SiH_4$, without any carrier or diluent gas, may be used. In a pumped system, the gas inlet pressure is about 0.32 torr. The substrate temperature is about 550° C.

In a typical plasma enhanced chemical vapor deposition process, a gas mixture containing the following constituents may be used: 50 SCCM of silane, ($SiH_4$); 0–150 SCCM of argon containing 1% phosphine, ($PH_3$); argon is used as a carrier gas for the balance to give a total gas mixture of 550 SCCM. The power is 200 watts and the pumped reactor pressure is 0.35 torr. The substrate temperature is 125°–325° C.

Following the deposition of the amorphous silicon film 58, metallic contacts are deposited for the N+ contact region 54 and for the amorphous silicon film 58. The metallic contacts comprise a barrier layer 60 of titanium tungsten and a layer 62 thereon of aluminum.

Figure 10:
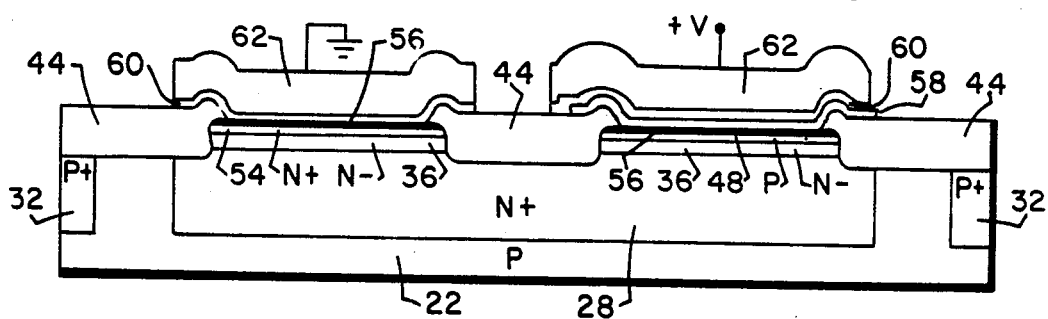

The contacts are shown in FIG. 10. Further fabrication processing, where dual metallization is provided, may include the deposition of a top layer of aluminum separated from the bottom layer 62 of aluminum by a glass layer of silicon dioxide, with the latter having openings to provide conductive contacts between the two levels of aluminum metalization.

Between each one of the contacts 62 shown in FIG. 10 there exists an electrical series path that includes the amorphous silicon film 58 of high resistance, the PN junction diode formed by the P type region 48 and the N type epitaxial layer 36, and the relatively low resistance path through the N+ buried layer 28, N− epitaxial layer 36 and N+ contact region 54. The amorphous silicon film 58, which is of high resistance in its virgin state, i.e. prior to programming, constitutes a vertical antifuse which can be switched to a low resistance state by the application of a suitable electrical bias voltage, and the PN junction diode comprising the P type region 48 and the N− epitaxial layer 36 constitutes the vertical array diode that is not switchable.

In a programming operation the contact layer 62 for the N+ contact region 54 is coupled to a negative or reference potential, such as ground, and the contact layer 62 for the amorphous silicon film 58 is coupled to a source of positive potential, such as 7 to 24 volts. The PN junction diode comprising the P type region 48 and the epitaxial layer 36 is forward biased and current will flow through the diode in the forward direction. Substantially all of the applied potential difference will appear across the amorphous silicon film 58 in its thickness direction. The amount of bias voltage is enough to switch the amorphous silicon film 58 from a high resistance state to a low resistance state, thereby completing an electrical circuit path between a bit line, such as the contact 62 over the amorphous silicon film 58 or a line connected thereto, and a word line, such as contact 62 over the N+ contact region 54 or a line connected thereto. Once the state of the amorphous silicon film 58 is switched, it is irreverisble. That is, the amorphous silicon film 58 cannot be switched back to its highly resistive state by applying another bias voltage.

The use of an amorphous silicon film 58 acting as an antifuse and deposited directly over the array diode, such as semiconductor regions 48 and 36 that are formed within the semiconductor body, has certain advantages over prior art structures exemplified by UK patent applications GB No. 2086654A and GB No. 2065972A referred to above. In some of those structures, the amorphous silicon layer or antifuse film is deposited directly in contact with a metal silicide film that forms a Schottky diode which acts as the array diode. The fact that a structural transformation in the amorphous film is necessary in order to make the transition from non-conducting to conducting state may cause a serious problem. When the metal silicide is in direct contact with the amorphous film, the transformation of the amorphous film is apt to cause a disruption of the metal silicide that is used to form the Schottky diode. Because of the disruption, the Schottky diodes will no longer retain their diode behavior after the amorphous film is switched.

The aforementioned problem does not occur with the structure according to the invention because it uses a PN semiconductive junction located within the body of semiconductor that is spaced a distance away from the amorphous silicon film. In fact, it is spaced away from the amorphous silicon film by two regions or layers, one region being the P type semiconductor region 48 and the other region being the metallic silicide layer 56. Although the metal silicide layer 56 is also in direct contact with the amorphous silicon film 58, the silicide layer functions as an ohmic contact rather than a diode, and the silicide integrity in this case is not essential to the proper functioning to the memory circuit because disruption of the silicide will not perturb the electrical contact between the amorphous silicon and the PN semiconductor junction diode.

The structure according to the invention also has great ease of manufacturing and cost advantages over the all-deposited film structures exemplified in the British applications referred to above, since the use of junction diodes formed in the semiconductor body in combination with deposited films of amorphous silicon is more compatible with existing semiconductor manufacturing processes.

What we claim is:

1. A method of fabricating a semiconductive programmable read only memory cell, comprising:
    (a) locally oxidizing selected surface regions of a body of crystalline semiconductor of first type conductivity to produce a plurality of isolated semiconductor regions in said body;
    (b) introducing dopant impurities of opposite second type conductivity in a first one of said isolated semiconductor regions to produce a first region of second type conductivity forming a semiconductive junction with said body at a location beneath the surface of said body;
    (c) depositing a thin amorphous layer of silicon over the surface of said first region and coupled therewith to produce an antifuse element that is electrically and irreversibly switchable from high resistance state to low resistance state; and
    (d) introducing dopant impurities of first type conductivity in a second one of said isolated semiconductor regions lying adjacent to said first isolated region to form a low resistance contact region at the surface of said body.

2. A method according to claim 1 and further including forming a low resistance semiconductor region of first type conductivity within said body spaced from and lying beneath said semiconductive junction and said low resistance contact region.

3. A method according to claim 1 wherein said thin amorphous layer of silicon is formed by plasma enhanced chemical vapor deposition.

4. A method according to claim 1, wherein said thin amorphous layer of silicon is formed by sputtering.

5. A method according to claim 1, wherein said thin amorphous layer of silicon is formed by evaporation in vacuum.

6. A method according to claim 1, wherein said thin amorphous layer of silicon is formed by low pressure chemical vapor deposition.

7. A method according to claim 1, wherein said body of semiconductor is formed of monocrystalline silicon.

8. A method according to claim 1, wherein the step in (c) is preceded by the step of forming a conductive layer along the surface of said first region followed by the step of depositing said thin amorphous layer of silicon on said conductive layer, said conductive layer forming contact to both said first region and said amorphous silicon layer.

9. The invention according to claim 8, wherein said conductive layer is formed as a metallic silicide alloy layer.

10. The invention according to claim 9, wherein said conductive layer is formed from a metallic silicide alloy selected from the group consisting of platinum silicide, platinel silicide, and palladium silicide.

11. A method of fabricating a programmable read-only memory cell according to the steps of:
    creating means to laterally electrically isolate islands of an upper zone of first type conductivity in a monocrystalline semiconductive body;
    introducing an impurity of opposite second type conductivity into a first of the islands to produce therein a region of second type conductivity extending along the upper surface of the island and forming a PN junction fully laterally bounded by the side boundaries of the island;
    depositing above the region a highly resistive amorphous semiconductive layer which is electrically coupled to the region and which is electrically and irreversibly switchable to a low resistance state; and
    creating a path of first type conductivity in the body extending from the PN junction through a second of the islands to its upper surface.

12. A method according to claim 11 wherein the step of depositing comprises depositing substantially undoped semiconductive material.

13. A method according to claim 11 wherein the step of depositing comprises depositing semiconductive material doped with a semiconductor impurity.

14. A method according to claim 11 wherein the step of depositing comprises depositing semiconductive material doped with an impurity of the first type conductivity.

15. A method according to claim 14 wherein the step of depositing is performed by sputtering.

16. A method according to claim 11 further including, before the step of depositing, the step of forming an electrically conductive layer in ohmic contact with the region along its upper surface, the amorphous layer being deposited on the conductive layer.

17. A method according to claim 16 wherein: the body comprises silicon; and the conductive layer comprises a metal silicide.

18. A method according to claim 11 further including, before the step of depositing, the step of forming first and second metal silicide layers in ohmic contact with the region and the second island, respectively, along their upper surfaces, the amorphous layer being deposited on the first metal silicide layer.

19. A method according to claim 18 further including the step of forming first and second electrically conductive layers on the first metal silicide layer and the amorphous layer, respectively, the amorphous layer being switched to its low resistance state upon application of a voltage of sufficient magnitude between the conductive layers in the forward conductive direction of the PN junction.

* * * * *

UNITED STATES PATENT AND TRADEMARK OFFICE
CERTIFICATE OF CORRECTION

PATENT NO. : 4,569,121

DATED : February 11, 1986

INVENTOR(S) : S. LIM et al

It is certified that error appears in the above-identified patent and that said Letters Patent is hereby corrected as shown below:

Claim 19, lines 3 and 4, change "first metal silicide layer and the amorphous" to -- amorphous layer and the second metal silicide --.

Signed and Sealed this

Thirtieth Day of December, 1986

*Attest:*

DONALD J. QUIGG

*Attesting Officer*     *Commissioner of Patents and Trademarks*